(12) United States Patent
Park (10) Patent No.: US 12,351,939 B2
(45) Date of Patent: Jul. 8, 2025

(54) INGOT GROWING APPARATUS AND METHOD THEREOF

(71) Applicant: SK SILTRON CO., LTD., Gumi-si (KR)

(72) Inventor: Hyun Woo Park, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 268 days.

(21) Appl. No.: 18/172,900

(22) Filed: Feb. 22, 2023

(65) Prior Publication Data

US 2023/0287593 A1    Sep. 14, 2023

(30) Foreign Application Priority Data

Mar. 8, 2022    (KR) ........................ 10-2022-0029142

(51) Int. Cl.
*C30B 15/20*     (2006.01)
*G06N 3/08*     (2023.01)

(52) U.S. Cl.
CPC ............. *C30B 15/206* (2013.01); *G06N 3/08* (2013.01)

(58) Field of Classification Search
CPC . C30B 15/20; C30B 15/206; Y10T 117/1032; G06N 3/08
See application file for complete search history.

(56) References Cited

FOREIGN PATENT DOCUMENTS

| CA | 3134565 | A1 | * | 11/2020 | ............. | G06N 3/045 |
|---|---|---|---|---|---|---|
| CN | 110009094 | A | * | 7/2019 | | |
| CN | 111368434 | A | * | 7/2020 | ............. | C30B 15/20 |
| KR | 10-2015-0002207 | A | | 1/2015 | | |
| KR | 10-2016-0023352 | A | | 3/2016 | | |

OTHER PUBLICATIONS

Korean Office Action for KR Application No. 10-2022-0029142 dated Nov. 27, 2023, 7 pages.
Ren, et al. "Modeling and Application of Czochralski Silicon Crystal Growth Process Using Hybrid Model of Data-Driven and Mechanism-Based Methodologies," Journal of Process Control, vol. 104, 2021, pp. 74-85.

* cited by examiner

*Primary Examiner* — Robert M Kunemund
(74) *Attorney, Agent, or Firm* — Lewis Roca Rothgerber Christie LLP (57) ABSTRACT

An ingot growing apparatus is composed of a neck portion, a shoulder portion, a body portion, and a tail portion. The ingot growing apparatus comprises a memory configured to store an artificial neural network and a processor.
The processor learns the artificial neural network to obtain a primary shoulder shape model corresponding to training data, updates the obtained primary shoulder shape model based on shoulder information obtained during the growth of a shoulder portion of a first ingot to obtain a secondary shoulder shape model, sets a target tail temperature for growth a tail portion of the first ingot based on the secondary shoulder shape model, and controls the growth of the tail portion of the first ingot according to the set target tail temperature.

10 Claims, 8 Drawing Sheets

INGOT GROWING APPARATUS AND METHOD THEREOF

CROSS-REFERENCE TO RELATED APPLICATION

This application claims priority to Korean Patent Application Number 10-2022-0029142, filed on Mar. 8, 2022, the entire content of which is incorporated herein by reference.

BACKGROUND

The embodiment relates to an ingot growing apparatus and a method thereof.

In general, CZochralski (hereinafter referred to as CZ) method is widely used as a method for manufacturing a silicon wafer. In the CZ method, polycrystalline silicon is charged into a quartz crucible. This is heated and melted by a graphite heating element. Thereafter, a seed crystal is immersed in silicon melt formed as a result of melting, and crystallization occurs at the interface. Thereafter, a silicon single crystal ingot is grown by pulling up the seed crystal while rotating it.

That is, the ingot may be grown through a neck process, a shoulder process, a body process, and a tail process. In this case, the ingot may include a neck portion grown through the neck process, a shoulder portion grown through the shoulder process, a body portion grown through the body process, and a tail portion grown through the tail process.

Among them, the tail process is a process of reducing the diameter while maintaining a slip dislocation state in the body portion of the ingot, and it is very difficult to control the tail process. The tail portion of the ingot has a shape in which the diameter gradually decreases. In order to grow the tail portion having this shape, when a target pulling speed, a target tail temperature, etc. are manually input by an operator with reference to a recipe, the growth of the tail portion of the ingot is controlled according to the corresponding recipe.

In this way, since the operator manually sets a target value for the growth of the tail portion, it is difficult to maintain the slip dislocation (pop out or structure loss occurs), and it is difficult to set an optimal target value, which increases the tail process time. In addition, since the thermal environment changes every time the ingot grows, the tail portion of the ingot of the same shape does not grow when controlled with the same target value. There is a problem in which the reflection cycle of the target value is very long since the target value for the growth of the tail portion can be set for the next ingot growth after the ingot growth is completed.

SUMMARY

An object of embodiments is to solve the foregoing and other problems.

The other object of the embodiment is to provide an ingot growing apparatus and a method thereof capable of growing an optimal tail portion of an ingot using an artificial neural network.

Another object of the embodiments is to provide an ingot growing apparatus and a method thereof capable of always growing a tail portion of an ingot in the same shape even if the thermal environment changes during ingot growth.

Another object of the embodiments is to provide an ingot growing apparatus and a method thereof capable of reflecting in real time a target value for growing a tail portion of the ingot.

The technical problems of the embodiments are not limited to those described in this section, and include those that can be grasped through the description of the invention.

According to a first aspect of the embodiment to achieve the above or other object, an ingot growing apparatus for growing an ingot composed of a neck portion, a shoulder portion, a body portion, and a tail portion, comprising: a memory configured to store an artificial neural network; and a processor, wherein the processor is configured: to learn the artificial neural network to obtain a primary shoulder shape model corresponding to training data, to update the obtained primary shoulder shape model based on shoulder information obtained during the growth of a shoulder portion of a first ingot to obtain a secondary shoulder shape model, to set a target tail temperature for growth a tail portion of the first ingot based on the secondary shoulder shape model, and to control the growth of the tail portion of the first ingot according to the set target tail temperature.

The training data is a shoulder shape image data collected and accumulated every time shoulder portions of a plurality of ingots grow for a certain period of time.

The obtained shoulder information includes an actual temperature and an actual diameter.

Each term of the polynomial of the target tail temperature and each term of the polynomial of a target shoulder temperature set for growth of the shoulder portion of the first ingot have opposite signs to each other.

The processor is configured to generate a primary tail shape model based on tail shape image data obtained when the tail portion of the first ingot is grown.

The processor is configured to update the primary tail shape model based on tail information obtained when a tail portion of a second ingot is grown to obtain a secondary tail shape model.

The processor is configured to set a target shoulder temperature for growth of a shoulder portion of a third ingot based on the secondary tail shape model, and to control the growth of the shoulder portion of the third ingot according to the set target shoulder temperature.

According to a second aspect of the embodiment to achieve the above or other object, an ingot growing method for growing an ingot composed of a neck portion, a shoulder portion, a body portion, and a tail portion, comprising: learning the artificial neural network to obtain a primary shoulder shape model corresponding to training data; updating the obtained primary shoulder shape model based on shoulder information obtained during the growth of a shoulder portion of a first ingot to obtain a secondary shoulder shape model; setting a target tail temperature for growth a tail portion of the first ingot based on the secondary shoulder shape model; and controlling the growth of the tail portion of the first ingot according to the set target tail temperature.

The ingot growing method further comprises generating a primary tail shape model based on tail shape image data obtained when the tail portion of the first ingot is grown.

The ingot growing method further comprises updating the primary tail shape model based on tail information obtained when a tail portion of a second ingot is grown to obtain a secondary tail shape model.

The ingot growing method further comprises setting a target shoulder temperature for growth of a shoulder portion of a third ingot based on the secondary tail shape model; and controlling the growth of the shoulder portion of the third ingot according to the set target shoulder temperature.

The effects of the ingot growing apparatus and a method thereof according to the embodiment are described as follows.

According to the embodiment, by obtaining a shoulder shape model using an artificial neural network and setting a target tail temperature based on the obtained shoulder shape model (primary shoulder shape model), a tail portion of the ingot that is standardized and optimal can be grown. Even if the thermal environment is changed, the tail portion of the ingot can always grow in the same shape.

According to the embodiment, an optimal shoulder shape model (secondary shoulder shape model) is obtained by updating the shoulder shape model acquired based on the artificial neural network with shoulder-related data obtained during a growth of a shoulder portion of the ingot, and a target tail temperature is set based on the obtained secondary shoulder shape model. Accordingly, it is possible to grow a higher quality ingot within a faster time through real-time reflection.

A further scope of applicability of the embodiments will become apparent from the detailed description that follows. However, since various changes and modifications within the spirit and scope of the embodiments can be clearly understood by those skilled in the art, it should be understood that the detailed description and specific embodiments, such as preferred embodiments, are given by way of example only.

DETAILED DESCRIPTION OF THE EMBODIMENTS

Hereinafter, the embodiments disclosed in this specification will be described in detail with reference to the accompanying drawings, but the same or similar components are given the same reference numerals regardless of reference numerals, and redundant descriptions thereof will be omitted. The suffixes 'module' and 'portion' for the components used in the following descriptions are given or used interchangeably in consideration of ease of writing the specification, and do not themselves have a meaning or role that is distinct from each other. In addition, the accompanying drawings are for easy understanding of the embodiments disclosed in this specification, and the technical idea disclosed in this specification is not limited by the accompanying drawings. Also, when an element such as a layer, region or substrate is referred to as being 'on' of another element, this includes being directly on another element or having other intermediate elements in between.

Figure 1:
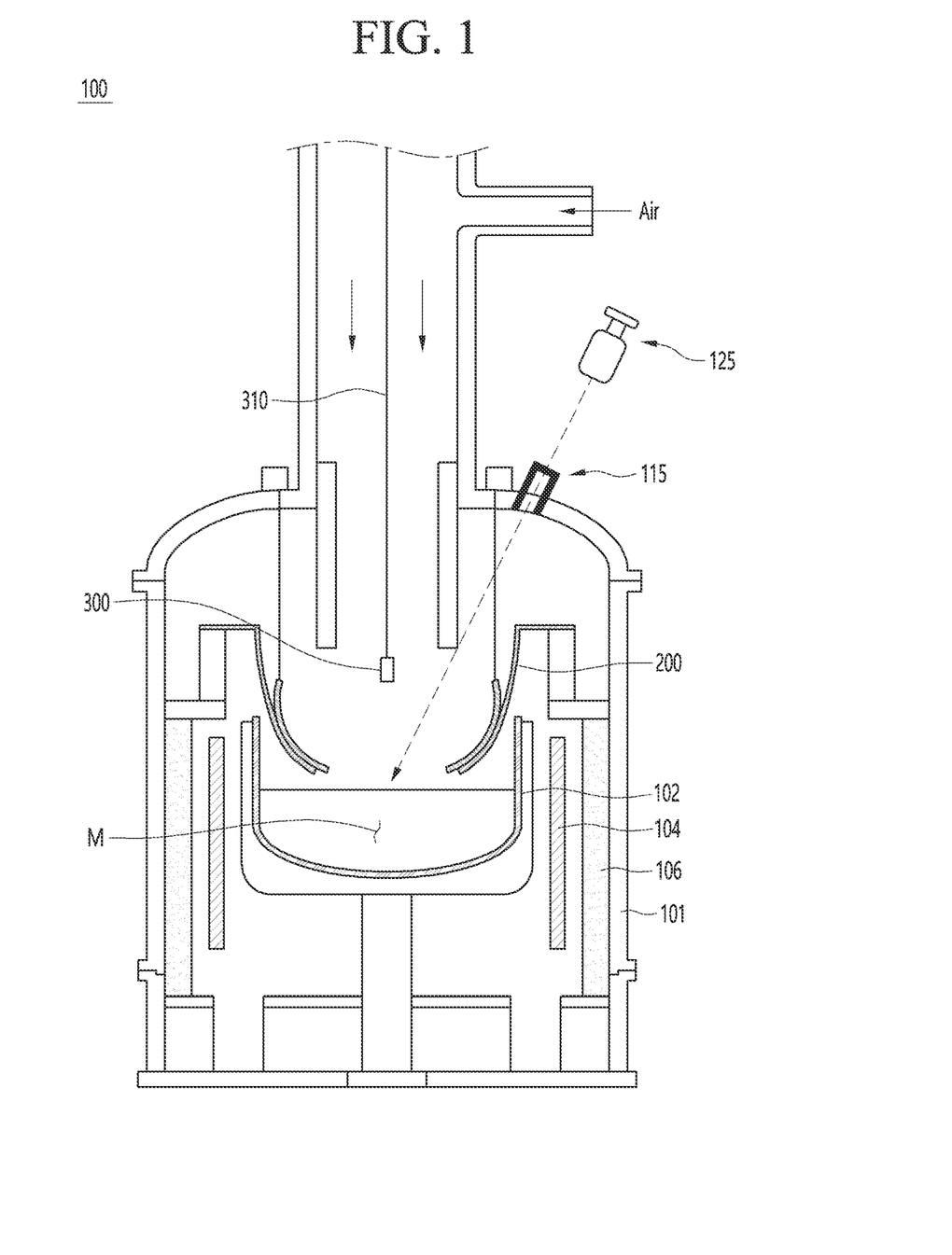
FIG. 1 is a cross-sectional view showing an ingot growing apparatus according to an embodiment.

FIG. 1 is a cross-sectional view showing an ingot growing apparatus according to an embodiment.

Referring to FIG. 1, an ingot growing apparatus 100 according to an embodiment may comprise a chamber 101, a crucible 102, a heater 104, a first heat shield portion 106, and a second heat shield portion 200.

The chamber 101 provides a space in which predetermined processes for growing a silicon single crystal ingot, which is a basic material of a semiconductor integrated circuit, are performed.

The crucible 102 is a hot zone structure installed inside the chamber 101, and silicon melt M may be accommodated therein. The crucible 102 is connected to a driving device and can be rotated and/or moved up and down.

A heater 104 may be disposed around an outer periphery of the crucible 102. The heater 104 may generate thermal energy to be applied to the crucible 102 to melt polycrystalline silicon.

The first heat shield portion 106 may be disposed between the chamber 101 and the heater 104 to have insulation capability so that heat applied from the heater 104 to the crucible 102 is not discharged to the outside of the chamber 101.

A seed chuck 300 in which a seed for growing a silicon single crystal ingot is accommodated may be disposed on the crucible 102. In addition, a cable 310 for rotating and/or moving up and down the seed chuck 300 may be connected to the seed chuck 300. The cable 310 is connected to the driving device so that it can be rotated and/or moved up and down.

The second heat shield portion 200 may be disposed to prevent heat from being discharged from the upper side of the crucible 102 to the outside.

As shown in FIG. 1, the ingot growing apparatus 100 according to the embodiment may further include at least one or more sensors 125.

Each of the at least one sensor 125 may be installed on one side of the chamber 101 to obtain image data in real time from the side portion of the ingot I. That is, each of the one or more sensors 125 may be installed on a viewport 115 disposed above the chamber 101, but is not limited thereto. At least one sensor 125 may include a camera, but is not limited thereto.

Polycrystalline silicon may be melted by the heater 104 to become a melt M.

The seed of the cable 310 is accommodated in the seed chuck 300, and the cable is moved down immerse the seed of the seed chuck 300 in the melt M.

Thereafter, as the cable 310 rotates and/or moves up, the melt M adheres to the seed so that the ingot I may grow. The cable 310 (or the ingot I) may be rotated and/or moved up until the desired length of the ingot I is grown. The ingot may be rotated at a predetermined rotational speed.

Figure 3:
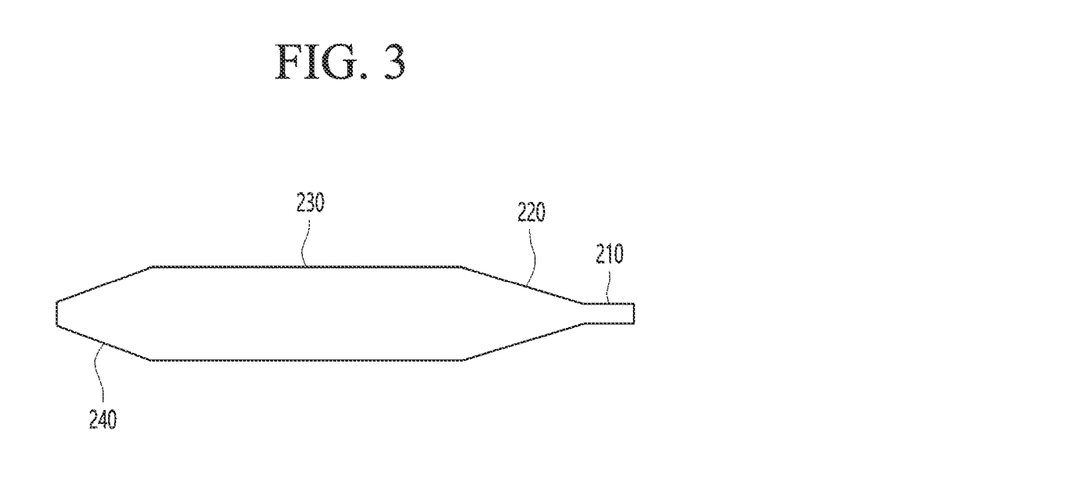
FIG. 3 is a cross-sectional view showing an ingot.

In an embodiment, the ingot I may be grown by a neck process, a shoulder process, a body process, and a tail process. As shown in FIG. 3 by each of the neck process, the shoulder process, the body process, and the tail process, the neck portion 210, the shoulder portion 220, the body portion 230, and the tail portion 240 of the ingot I can be grown sequentially.

On the other hand, according to the embodiment, by obtaining a shoulder shape model using an artificial neural network and setting a target tail temperature based on the obtained shoulder shape model (primary shoulder shape model), an optimal tail portion of the ingot that is standardized and optimal can be grown. In addition, even if the thermal environment is changed, the tail portion of the ingot can always grow in the same shape.

According to the embodiment, an optimal shoulder shape model (secondary shoulder shape model) is obtained by updating the shoulder shape model acquired based on the artificial neural network with shoulder-related data obtained during a growth of a shoulder portion of the ingot, and a target tail temperature is set based on the obtained secondary shoulder shape model. Accordingly, it is possible to grow a higher quality ingot within a faster time through real-time reflection.

Hereinafter, embodiments having various technical advantages described above will be described in more detail.

Figure 2:
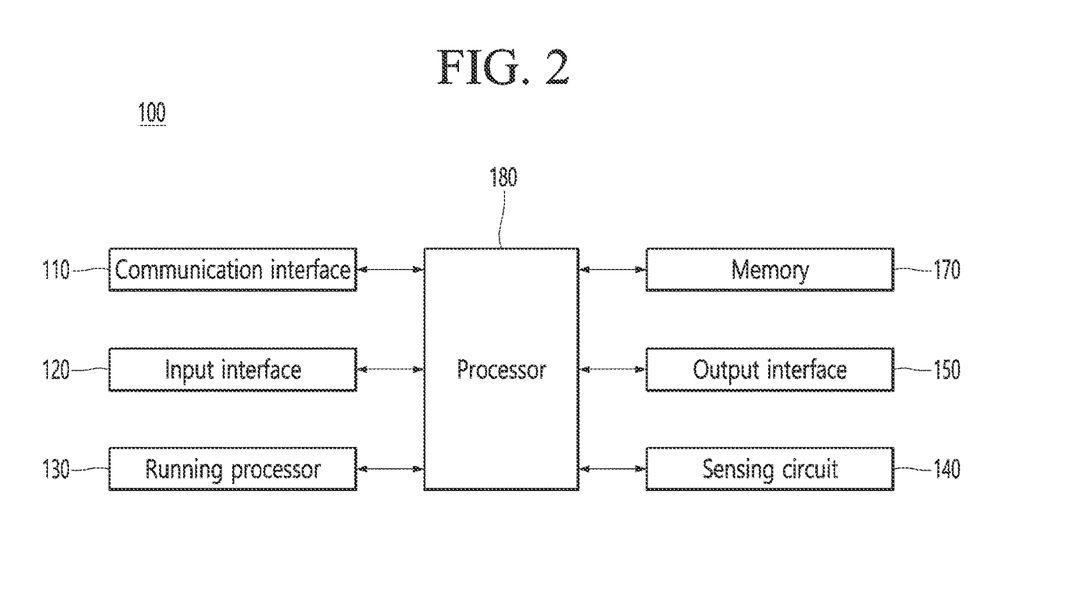
FIG. 2 is a block diagram showing an ingot growing apparatus according to an embodiment.

FIG. 2 is a block diagram showing an ingot growing apparatus according to an embodiment.

Referring to FIG. 2, the ingot growing apparatus 100 according to the embodiment may comprise a communication interface 110, an input interface 120, a running processor 130, a sensing circuit 140, an output interface 150, a memory 170 and a processor 180. The ingot growing apparatus 100 according to the embodiment may be an artificial intelligence (AI) device that performs a learning algorithm. Therefore, the ingot growing apparatus 100 and the AI device according to the embodiment may be called interchangeably.

The communication interface 110 may transmit/receive data to/from other devices or external devices such as servers using wired/wireless communication technology.

The input interface 120 may receive image data. In addition, the input interface 120 may obtain various types of data, such as receiving a voice signal and receiving a user input for obtaining data from a user.

The learning processor 130 may learn a model composed of an artificial neural network using training data. Here, the learned artificial neural network may be referred to as a learning model. The learning model may be used to infer a result value for new input data other than learning data, and the inferred value may be used as a basis for making a decision to perform a certain operation.

The artificial intelligence model to be loaded in the ingot growing apparatus 100 according to the embodiment may be learned in the running processor 130, and may also be transmitted from an external device or server.

The sensing circuit 140 may obtain at least one of internal information of the AI device 100, surrounding environment information of the AI device 100, and user information using various sensors 125. Also, the sensing circuit 140 may include a camera.

At least one sensor 125 shown in FIG. 1 may be included in the sensing circuit 140, but is not limited thereto.

The output interface 150 may generate an output related to sight, hearing, or touch.

The memory 170 may store data which support various functions of the AI device 100. For example, the memory 170 may store input data, learning data, a learning model, a learning history, and the like obtained from the input interface 120.

The processor 180 may determine at least one executable operation of the AI device 100 based on information determined or generated using a data analysis algorithm or a machine learning algorithm. The processor 180 may perform the determined operation by controlling the components of the AI device 100.

The processor 180 may control an overall operation of the ingot growing apparatus 100 according to the embodiment.

As the seed chuck 300 shown in FIG. 1 rotates and/or moves up and the temperature is controlled, the melt M adheres to the seed, and as shown in FIG. 3, the neck portion 210, the shoulder portion 220, the body portion 230 and the tail portion 240 may be sequentially grown.

Figure 4:
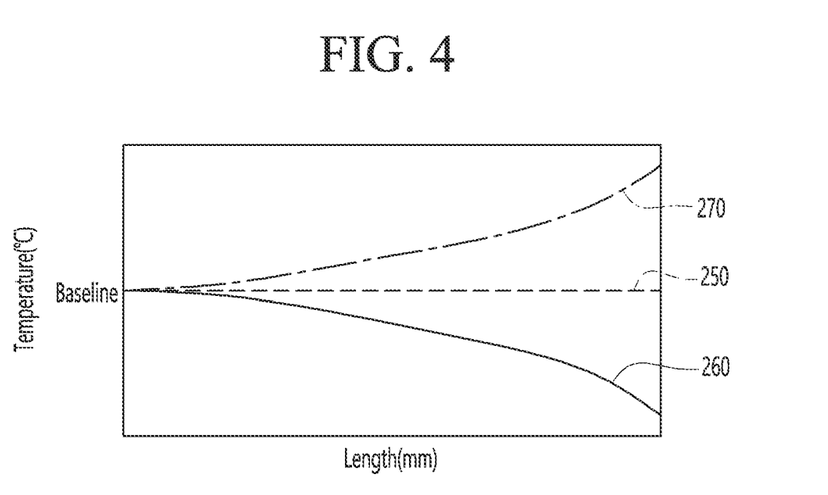
FIG. 4 shows a shoulder temperature curve and a tail temperature curve.

As shown in FIG. 3, the tail portion 240 of the ingot I may have the same or similar shape as the shoulder portion 220. As such, as shown in FIG. 4, in order for the shoulder portion 220 and the tail portion 240 to have the same or similar shape, the shoulder temperature curve 260 and the tail temperature curve 270 may be symmetrical to each other with respect to a horizontal line (or baseline) 250 crossing the reference temperature. For example, the reference temperature may be 1350° C. to 1450° C., but is not limited thereto.

The shoulder portion 220 may grow depending on a target shoulder temperature that is, a target temperature of the shoulder portion 220 according to the growth length of the shoulder temperature curve 260. For example, as the target shoulder temperature decreases according to the growth length in the shoulder temperature curve 260, the diameter of the shoulder portion 220 may increase according to the growth length.

The tail portion 240 may grow depending on a target tail temperature according to the growth length of the tail temperature curve 270. For example, as the target tail temperature increases according to the growth length in the tail temperature curve 270, the diameter of the tail portion 240 may decrease according to the growth length.

Meanwhile, the shoulder diameter curve may have an inverse proportional relationship with the shoulder temperature curve 260, and the tail diameter curve may have an inverse proportional relationship with the tail temperature curve 270. That is, when a target shoulder temperature gradually decreases according to the growth length in the shoulder temperature curve 260, the shoulder portion 220 may have a shoulder diameter curve in which the diameter gradually increases. When the target tail temperature gradually increases according to the growth length in the tail temperature curve 270, the tail portion 240 may have a tail diameter curve in which the diameter gradually decreases.

In the embodiment, a target temperature (hereinafter, referred to as the target tail temperature) of the tail portion may be set using the relationship between the diameter of the shoulder portion and the diameter of the tail portion.

That is, a shoulder shape model (primary shoulder shape model) related to the shape of the shoulder portion is obtained using an artificial neural network, and the obtained primary shoulder shape model is updated based on shoulder-related data obtained while growing the actual ingot to obtain a secondary shoulder shape model. A target tail temperature for growth of the tail portion may be set based on the secondary shoulder shape model, and the growth of a tail portion of a first ingot may be controlled according to the set target tail temperature. Accordingly, the tail portion of the ingot that is standardized and optimal can be grown. For example, the target tail temperature may be set by adjusting the value of each term in the polynomial of the target tail temperature curve.

Specifically, the processor 180 may learn the artificial neural network to obtain a primary shoulder shape model corresponding to training data.

Here, the training data may be image data related to shapes of the shoulder portions that are collected and accumulated every time the shoulder portion of a plurality of ingots grows for a certain period of time.

As an example, a plurality of ingots may be grown, and the shape of the shoulder portion of each of the plurality of ingots may be obtained whenever each of the plurality of ingots is grown. These obtained shapes of the shoulder portions may be used as inputs to an artificial neural network as training data. Accordingly, by learning the artificial neural network, training data, that is, a primary shoulder shape model corresponding to the shape of the shoulder portion may be obtained. As the amount of training data increases, a more optimized primary shoulder shape model can be obtained.

As another example, the shapes of the shoulder portions collected through the already accumulated ingot growth may be provided as training data. By learning the provided training data through an artificial neural network, a primary shoulder shape model may be obtained.

For example, the primary shoulder shape model may be a shoulder shape according to a growth length. For example, the primary shoulder shape model may be a change in diameter according to the growth length.

Figure 5A:
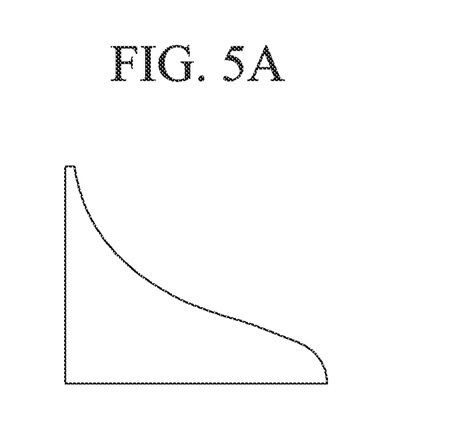
FIG. 5A shows a shoulder shape of an ingot.
Figure 5B:
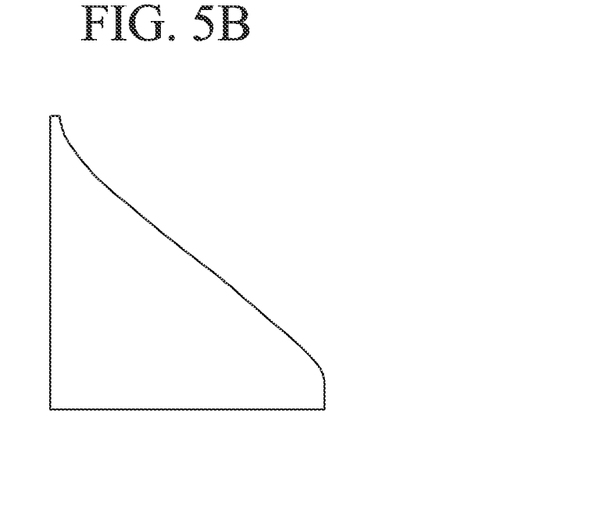
FIG. 5B shows a shoulder shape of another ingot.

For example, a primary shoulder shape is obtained by learning shoulder shape of an ingot (FIG. 5A) as training data, and the obtained primary shoulder shape may be optimized by learning shoulder shape of another ingot (FIG. 5B) as training data. The shape can be optimized. Although the drawing shows that the first shoulder shape is optimized by learning the shoulder shapes of two ingots (FIG. 5A and FIG. 5B), the primary shoulder shape can be optimized by learning the shoulder shape for more ingots. That is, by learning a large number of training data, an optimal primary shoulder shape can be obtained. The optimal primary shoulder shape may be a shoulder shape with minimal defects and a constant diameter.

The processor 180 may obtain a secondary shoulder shape model by updating the primary shoulder shape model obtained based on shoulder information obtained when the shoulder portion of the first ingot is grown. Here, the first ingot may be an ingot actually grown by the ingot growing apparatus 100 shown in FIG. 1. That is, in the ingot growing apparatus 100, the neck portion, the shoulder portion, the body portion, and the tail portion are sequentially grown to complete the first ingot.

For example, the secondary shoulder shape model may be a shoulder shape according to the growth length. For example, the secondary shoulder shape model may be a change in diameter according to the growth length.

Simultaneously with the growth of the shoulder portion of the first ingot, shoulder information on the growing shoulder portion may be obtained. The shoulder portion of the first ingot may be grown using a predetermined target shoulder temperature curve. When training data is learned using an artificial neural network to obtain a primary shoulder shape model, a target shoulder temperature may be set by adjusting the value of each term in the polynomial of the target shoulder temperature curve.

The target shoulder temperature curve may be expressed by Equation 1.

$$y1 = -2E-06x^4 + 0.0005x^3 - 0.0477x^2 + 0.3822x + 0.255 \quad \text{[Equation 1]}$$

x may denote a growth length, and y1 may denote a target shoulder temperature curve. For example, the target shoulder temperature may vary according to the growth length by adjusting the value of each term of the polynomial of the target shoulder temperature curve y1. In Equation 1, the target shoulder temperature curve y1 is composed of a 4th polynomial, but is not limited thereto.

The shoulder information may include an actual temperature, an actual diameter, and the like. The actual temperature may be an actual temperature measured when the shoulder portion of the first ingot is grown. The actual diameter may be an actual diameter of the shoulder portion of the grown first ingot. The actual diameter may vary depending on the length of growth. For example, the actual diameter may increase progressively with the growth length.

For example, the actual temperature may be measured from a temperature-related sensor installed on one side of the ingot growing apparatus 100 or extracted from a thermal image obtained from a thermal image sensor. For example, the actual diameter may be calculated from an image obtained from a video camera installed on one side of the ingot growing apparatus 100. During growth of the shoulder portion of the first ingot, the diameter according to the growth length may vary depending on a change in temperature or surrounding environment.

The obtained primary shoulder shape model may be updated based on the shoulder information, and a secondary shoulder shape model may be obtained.

Based on the shoulder information, the shape of the shoulder portion can be calculated as shown in Equation 2.

$$Y = f(\text{actual temperature/actual diameter derivative}) \quad \text{[Equation 2]}$$

The shape of the shoulder portion may be calculated by substituting the actual temperature and the actual diameter included in the shoulder information into Equation 2. For example, a differential value obtained by differentiating the actual diameter according to the growth length may be substituted into Equation 2.

A secondary shoulder shape model may be obtained by comparing the shape of the shoulder portion in the obtained primary shoulder shape model with the shape of the shoulder portion calculated by Equation 2. For example, a secondary shoulder shape model may be obtained by updating the shoulder shape in the primary shoulder shape model to the shoulder shape calculated by Equation 2, but is not limited thereto.

If a second ingot is actually grown, the secondary shoulder shape model is updated based on shoulder information obtained when a shoulder portion of the second ingot is grown to obtain a tertiary shoulder shape model. In this way, a newly updated shoulder shape model may be obtained whenever a shoulder portion of each of the ingots actually grows.

The processor 180 may set a target tail temperature for growth of the tail portion of the first ingot based on the secondary shoulder shape model. The target tail temperature may be set using a target tail temperature curve.

The target tail temperature curve can be expressed by Equation 3.

$$y2 = +2E-06x^4 - 0.0005x^3 + 0.0477x^2 - 0.3822x - 0.255 \quad \text{[Equation 3]}$$

x may denote a growth length, and y2 may denote a target tail temperature curve.

As shown in Equation 3, each term in the polynomial of the target tail temperature curve y2 may have a sign opposite to that of each term in the polynomial of the target shoulder temperature curve y1 denoted in Equation 1. That is, Table 1 shows a sign relationship between each term in the polynomial of the target shoulder temperature curve y1 and each term in the polynomial of the target tail temperature curve y2.

TABLE 1

| | Target shoulder temperature curve y1 | Target tail temperature curve y2 |
|---|---|---|
| 4th term ($x^4$) | − | + |
| 3rd term ($x^3$) | + | − |
| 2nd term ($x^2$) | − | + |
| 1st term ($x$) | + | − |
| 0th term | + | − |

From Table 1, the target shoulder temperature curve y1 and the target tail temperature curve y2 may be symmetrical to each other (see FIG. 4). For example, the target shoulder temperature curve y1 and the target tail temperature curve y2 may be symmetrical to each other with respect to the baseline 250. Therefore, the sign of each term in the polynomial of the target shoulder temperature curve y1 is changed to the opposite sign, thereby calculating the target tail temperature curve y2 for the growth of the tail portion of the first ingot, and thus the target tail temperature may be set by the calculated target tail temperature curve y2.

Meanwhile, when the shape of the shoulder portion in the secondary shoulder shape model is different from the shape of the shoulder portion in the primary shoulder shape model, the target tail temperature may be updated to match the secondary shoulder shape model. That is, the target tail temperature may be updated by adjusting the value of each term in the polynomial of the target tail temperature curve y2 such that the target tail temperature curve y2 is reset. In this case, the reset target tail temperature curve y2 may not be symmetrical with the target shoulder temperature curve y1.

The processor 180 may control growth of the tail portion of the first ingot according to the set target tail temperature. That is, the processor 180 may control temperature or other control information, such as pulling speed, rotation speed, and magnet strength, while the tail portion of the first ingot is grown according to the growth length based on the set target tail temperature.

As described above, based on the primary shoulder shape model optimized using an artificial neural network and the shoulder information obtained during the actual growth of the first ingot, the target tail temperature for the growth of the tail portion of the first ingot is set. The tail portion of the first ingot may be grown according to the target tail temperature. In this way, the tail portion of each of the ingots, such as the second ingot and the third ingot, can be standardized, and optimally grown.

Meanwhile, the processor 180 may set a target shoulder temperature for growing the shoulder portion of another ingot based on the tail shape model.

That is, the processor 180 may obtain image data of the tail portion of the first ingot while the tail portion of the first ingot is growing. Such image data may be obtained by a video camera installed on one side of the ingot growing apparatus shown in FIG. 1.

The processor 180 may generate a primary tail shape model based on the obtained image data. For example, the primary tail shape model may be a tail shape according to a growth length. For example, the primary tail shape model may be a shape of a change in diameter according to a growth length.

After the growth of the first ingot is completed, the second ingot may be grown.

When the second ingot grows, particularly when the tail portion of the second ingot grows, tail information on a tail portion of the second ingot may be obtained. The tail information may include an actual temperature, an actual diameter, and the like. The actual temperature may be an actual temperature measured when the tail portion of the second ingot is grown. The actual diameter may be the actual diameter of the tail portion of the grown second ingot.

The processor 180 may obtain a secondary tail shape model by updating the primary tail shape model based on the tail information obtained when the tail portion of the second ingot is grown.

The processor 180 may calculate a target shoulder temperature curve for growth of a shoulder portion of a third ingot based on the secondary tail shape model. By changing the sign of each term in the polynomial of the target tail temperature curve set for growing the tail portion of the third ingot to an opposite sign, the target shoulder temperature curve may be calculated, and the target shoulder temperature according to the growth length may be set by the target shoulder temperature curve.

The processor 180 may control the growth of the shoulder portion of the third ingot according to the set target shoulder temperature.

As described above, the target shoulder temperature of each of the ingots is set based on the tail shape model for the tail portion of each of the ingots, and the shoulder portion of the next ingot is standardized and optimally grown according to the set target shoulder temperature.

Meanwhile, referring to FIG. 2, an artificial intelligence model such as a learning model may be stored in the memory 170.

As an example, the processor 180 may load a learning model from the memory 170 and control the learning model to be learned.

As another example, the learning processor 130 may load a learning model from the memory 170 and control the learning model. The learning processor 130 may be included in the processor 180.

On the other hand, the artificial intelligence model, such as the learning model, has been described as being learned by the processor 180, but it will also be possible for the ingot growing apparatus 100 to receive the artificial intelligence model learned from an external device or server according to the embodiment.

Figure 6:
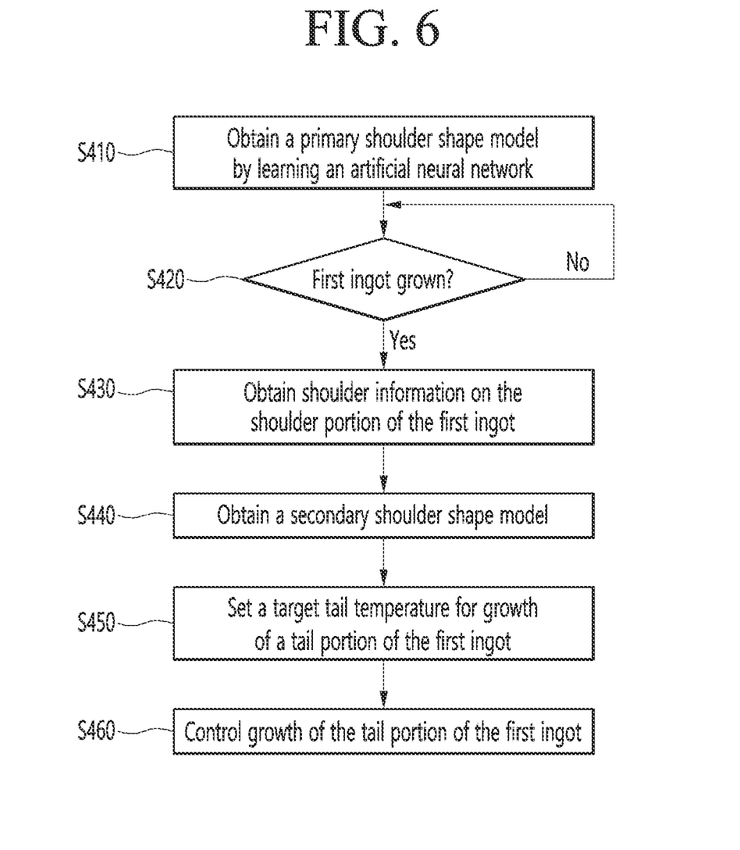
FIG. 6 is a flowchart illustrating an ingot growing method according to the first embodiment.

FIG. 6 is a flowchart illustrating an ingot growing method according to the first embodiment.

Referring to FIGS. 1, 2, and 6, the processor 180 may obtain a primary shoulder shape model by learning an artificial neural network (S410). That is, by inputting previously collected training data to the artificial neural network and learning the training data by the artificial neural network, the primary shoulder shape model may be learned as an optimal shoulder shape model. The target shoulder temperature may be set by the target shoulder temperature curve together with the primary shoulder shape model. That is, as in Equation 1, by adjusting the value of each term in the polynomial of the target shoulder temperature curve y1, the target shoulder temperature curve y1 is calculated, and the target shoulder temperature according to the growth length may be set by the target shoulder temperature curve y1 calculated as described above.

The primary shoulder shape model may be stored in memory 170.

The first ingot may be grown using the ingot growing apparatus shown in FIG. 1 (S420). That is, the neck portion, the shoulder portion, the body portion, and the tail portion of the first ingot may be sequentially grown.

When the shoulder portion of the first ingot is grown, shoulder information on the shoulder portion of the first ingot may be obtained (S430). The shoulder information includes an actual temperature, an actual diameter, and the like, and may be obtained from various sensors 125 such as a thermal imaging camera and a video camera.

The processor 180 may obtain a secondary shoulder shape model by updating the obtained primary shoulder shape model based on the obtained shoulder information (S440). The shoulder information may include an actual temperature, an actual diameter, and the like.

By substituting the obtained shoulder information into Equation 2, a shoulder shape of a shoulder portion of the first ingot is calculated, and the obtained shoulder shape of the primary shoulder shape model is updated to the shoulder shape of the first ingot to obtain a secondary shoulder shape model.

The processor 180 may set a target tail temperature for growth of a tail portion of the first ingot based on the secondary shoulder shape model (S450).

As shown in Equation 3, the sign of each term in the polynomial of the target tail temperature curve y2 may be opposite to the sign of each term in the polynomial of the target shoulder temperature curve y1, as shown in Equation 1.

Based on the change between the shoulder shape in the primary shoulder shape model and the shoulder shape in the secondary shoulder shape model, the target tail temperature curve y2 is calculated by adjusting the value of each term of the polynomial of the target tail temperature curve y2 shown in Equation 3, and a target tail temperature according to the growth length may be set based on the calculated target tail temperature curve y2.

For example, when there is no change between the shape of the shoulder portion in the primary shoulder shape model and the shape of the shoulder portion in the secondary shoulder shape model, the target tail temperature may be the same as a previous target tail temperature.

For example, when a change occurs between the shape of the shoulder portion in the primary shoulder shape model and the shape of the shoulder portion in the secondary shoulder shape model, the value of each term of the polynomial of the target tail temperature curve is adjusted such that the target tail temperature according to the growth length may be changed.

Figure 8:
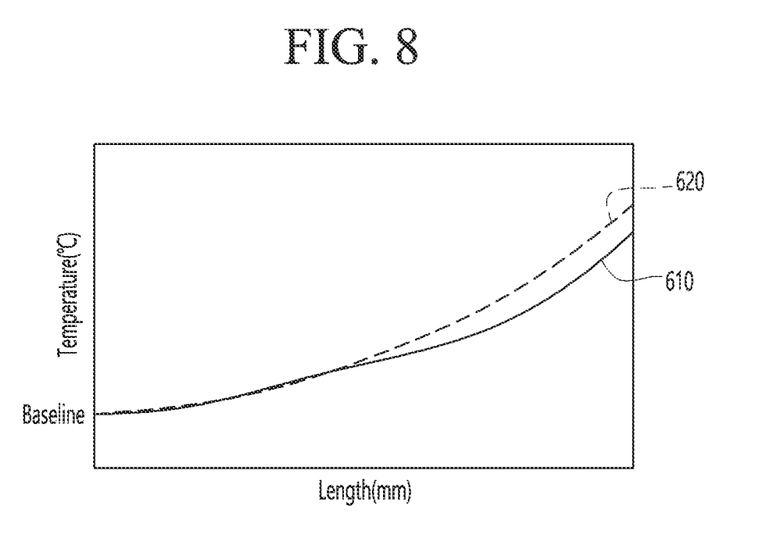
FIG. 8 shows a primary tail shape model and a secondary tail shape model.

As shown in FIG. 8, a first target tail temperature curve 610 may be a curve calculated by a secondary shoulder shape model updated based on shoulder information on the shoulder portion of the first ingot. A second target tail temperature curve 620 may be a curve calculated by a tertiary shoulder shape model updated based on shoulder information on the shoulder portion of the second ingot.

The second target tail temperature curve 620 may be different from the first target tail temperature curve 610 by reflecting shoulder information obtained from the shoulder portion of the second ingot. As such, since the shoulder information obtained from the shoulder portion of each of the ingots is reflected in the shoulder shape model, a third target tail temperature curve and a fourth target tail temperature curve may be different. Through this process, an optimized target tail temperature curve may be calculated.

Therefore, even if the surrounding environment changes every time each ingot grows, the tail portion of the ingot grows according to the target tail temperature based on the optimal target tail temperature curve through the optimization process. Thus, the growth of standardized and defect-free tail portion is possible, and productivity and yield can be improved by drastically shortening the tail processing time.

Referring back to FIG. 6, the processor 180 may control growth of the tail portion of the first ingot according to the set target tail temperature (S460).

The tail portion of the first ingot may be grown according to a target tail temperature set based on shoulder information obtained when the shoulder portion of the first ingot is grown. Specifically, a secondary shoulder shape model is obtained based on the primary shoulder shape model of the tail of the first ingot and the shoulder information obtained when the shoulder of the first ingot grows, and the first ingot may be grown according to the set target tail temperature based on the obtained secondary shoulder shape model.

According to the embodiment, the target tail temperature for the growth of the tail portion of the first ingot is optimally set based on the artificial neural network and the shoulder information obtained during the growth of the shoulder portion of the first ingot. Thus, the growth of standardized and defect-free tail portion is possible, and productivity and yield can be improved by drastically shortening the tail processing time.

Figure 7:
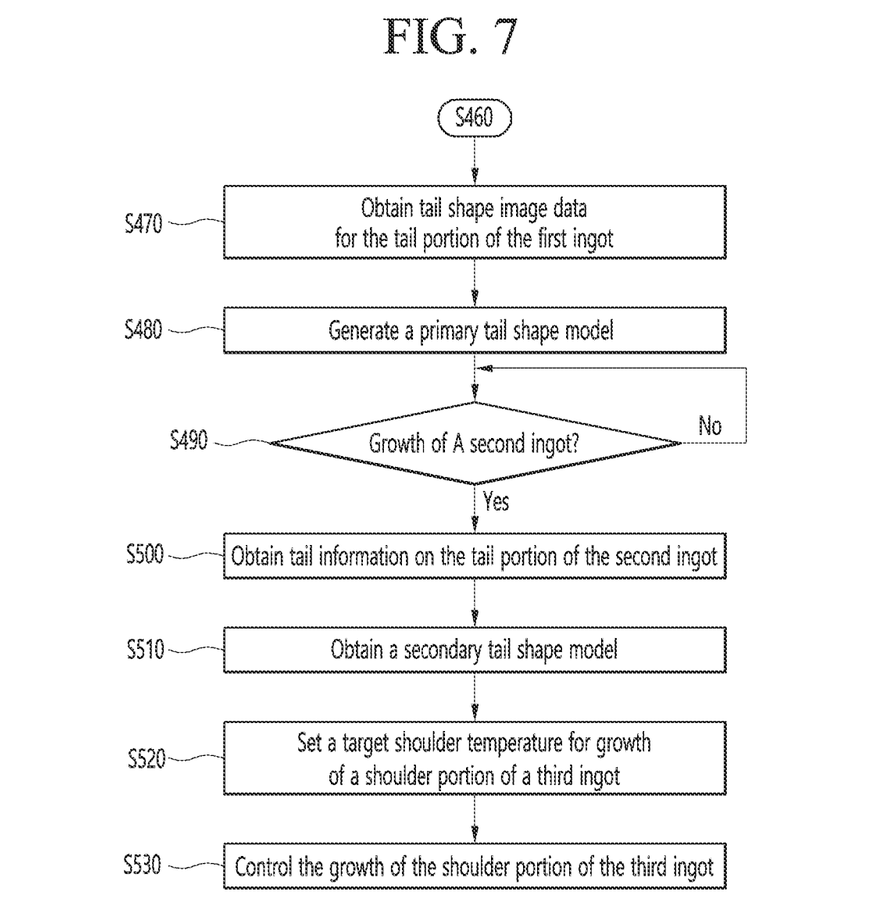
FIG. 7 is a flowchart illustrating an ingot growing method according to a second embodiment.

FIG. 7 is a flowchart illustrating an ingot growing method according to a second embodiment.

Referring to FIGS. 1, 2, and 7, when the tail portion of the first ingot grows, the processor 180 may obtain tail shape image data for the tail portion of the first ingot (S470), and generate a primary tail shape model based on the obtained tail shape image data (S480). While the tail portion of the first ingot is growing, the tail shape image data of the tail portion of the first ingot may be obtained by a sensor such as a video camera. As such, a primary tail shape model having a tail shape according to a growth length may be generated based on tail shape image data obtained in real time while the tail portion of the first ingot is growing. The generated primary tail shape model may be stored in the memory 170.

After the growth of the first ingot is completed, the growth of the second ingot may be performed (S490). For example, the neck portion, the shoulder portion, the body portion, and the tail portion of the second ingot may be sequentially grown.

When a tail portion of the second ingot is grown, tail information on the tail portion of the second ingot may be obtained (S500). The tail information may include an actual temperature, an actual diameter, and the like. The actual temperature may be an actual temperature within the chamber 101 when the tail portion of the second ingot is grown, but is not limited thereto. The actual diameter may be the actual diameter of the tail portion of the grown second ingot.

The processor 180 may obtain a secondary tail shape model based on the obtained tail information (S510). For example, a shape of the tail portion of the second ingot may be calculated based on the obtained tail information. In this case, the secondary tail shape model may be obtained by updating the tail shape of the primary tail shape model stored in the memory 170 to the calculated tail shape of the second ingot.

The processor 180 may set a target shoulder temperature for growth of a shoulder portion of the third ingot based on the secondary tail shape model (S520). Subsequently, the processor 180 may control the growth of the shoulder portion of the third ingot according to the set target shoulder temperature (S530).

For example, the target shoulder temperature curve y1 is calculated by adjusting the value of each term of the polynomial of the target shoulder temperature curve y1 shown in Equation 1 based on the changing aspect between the primary tail shape model and the secondary tail shape model. Thus, the target shoulder temperature according to the growth length may be set by the target shoulder temperature curve y1 calculated as described above.

According to the embodiment, a target shoulder temperature for growing the shoulder portion of the next ingot is set based on the tail shape model and the tail information obtained during the growth of the tail of each ingot, and the shoulder portion of the next ingot grows according to the set target shoulder temperature. Thus, the growth of standardized and defect-free shoulder portion is possible, and productivity and yield can be improved by drastically shortening the tail processing time.

Figure 9:
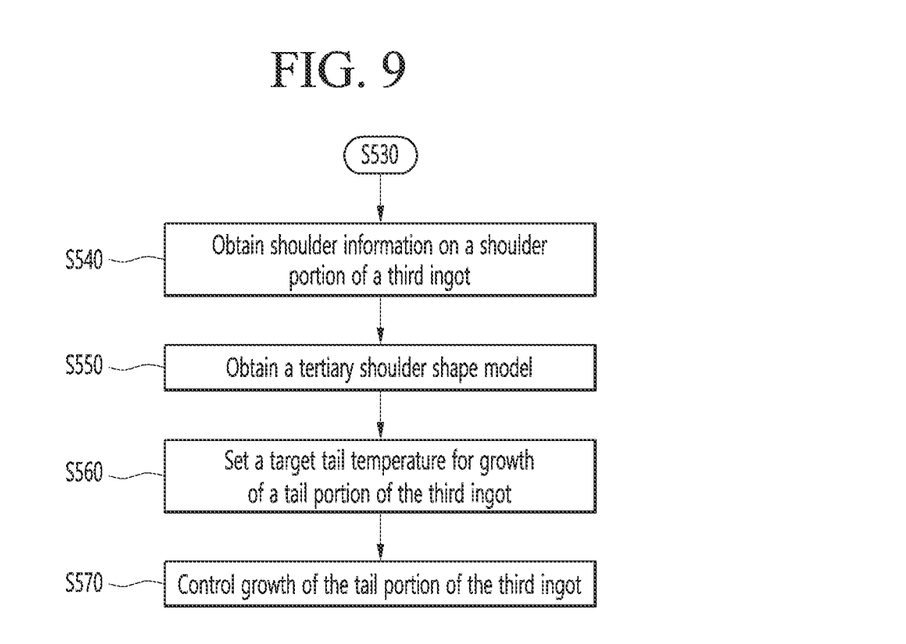
FIG. 9 is a flowchart illustrating an ingot growing method according to a third embodiment.

Meanwhile, the tail portion of each of the subsequent ingots, such as the third ingot and the fourth ingot, may be grown according to the target tail temperature set based on the corresponding shoulder shape model and shoulder information obtained when the shoulder portion of the corresponding ingot grows (see FIG. 9).

FIG. 9 is a flowchart illustrating an ingot growing method according to a third embodiment.

Referring to FIGS. 2 and 9, the processor 180 may obtain shoulder information on the shoulder portion of the third ingot (S540). While the shoulder portion of the third ingot is being grown, shoulder information on the shoulder portion of the third ingot may be obtained using various sensors. The shoulder information may include an actual temperature, an actual diameter, and the like.

The processor 180 may obtain a tertiary shoulder shape model based on the shoulder information on the shoulder portion of the third ingot (S550). A shoulder shape of the third ingot is calculated based on the shoulder information, and the shoulder shape of the secondary shoulder shape model (obtained in S440 of FIG. 6) is updated to the calculated shoulder shape to obtain a tertiary shoulder shape model.

The processor 180 may set a target tail temperature for growth of a tail portion of the third ingot based on the tertiary shoulder shape model (S560).

The target tail temperature curve y2 is adjusted to the value of each term of the polynomial of the target tail temperature curve y2 shown in Equation 3 based on the change aspect between the shoulder shape of the second shoulder shape model and the shoulder shape of the tertiary shape model. A target tail temperature according to the growth length may be set based on the target tail temperature curve y2 calculated as described above.

Figure 10:
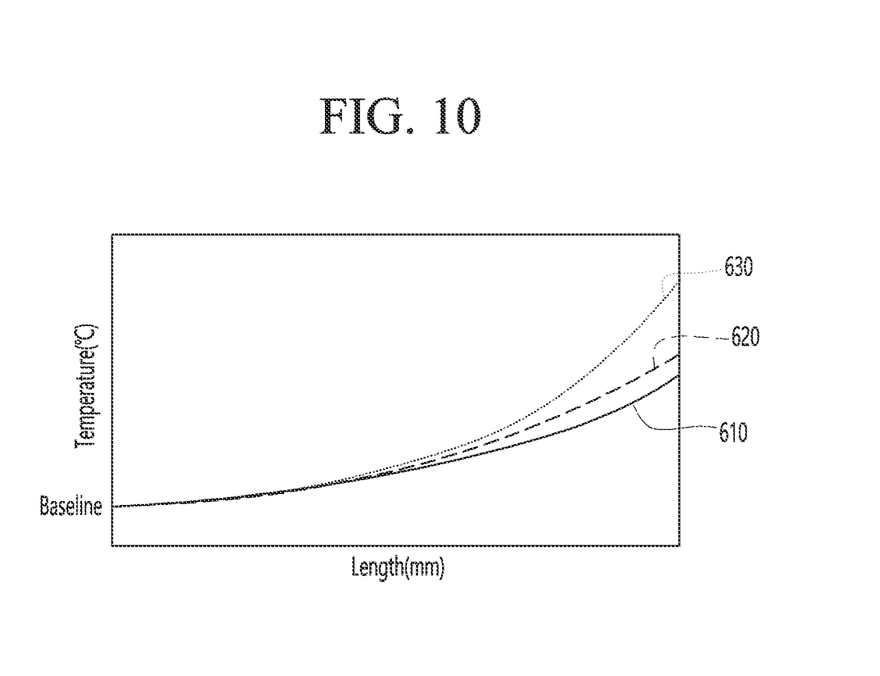
FIG. 10 shows a primary tail shape model, a secondary tail shape model, and a tertiary tail shape model.

As shown in FIG. 10, the first target tail temperature curve 610, the second target tail temperature curve 620, and the third target tail temperature curve 630 may be different from each other.

The first target tail temperature curve 610 may be a curve calculated by a secondary shoulder shape model updated based on shoulder information on the shoulder portion of the first ingot. The second target tail temperature curve 620 may be a curve calculated by a tertiary shoulder shape model updated based on shoulder information on the shoulder portion of the second ingot.

In the third target tail temperature curve 630, a target shoulder temperature for growth of the shoulder portion of the next ingot may be set based on a tail shape model obtained when the tail portion of the previous ingot is grown through feedforward, and when the shoulder portion of the ingot is grown according to the set target shoulder temperature, the shoulder shape model may be updated based on the shoulder information obtained for the shoulder portion of the corresponding ingot. Thus, the third target tail temperature curve 630 may be a curve calculated by the updated shoulder shape model.

Accordingly, the second target tail temperature curve 620 may be calculated based only on the shoulder shape model, but the third target tail temperature curve 630 may be calculated based on the tail shape model as well as the shoulder shape model. Therefore, when the tail portion of the ingot grows by the target tail temperature of the third target tail temperature curve 630, further standardized and defect-free tail growth is possible much more than when the tail portion of the ingot grows by the target tail temperature of the second target tail temperature curve 620.

The processor 180 may control growth of the tail portion of the third ingot according to the set target tail temperature (S570).

Meanwhile, the shoulder portion of each of the subsequent ingots, such as the third ingot and the fourth ingot, may be grown according to a target shoulder temperature set based on a corresponding tail shape model and tail information obtained when growing the tail of the previous ingot.

Figure 11:
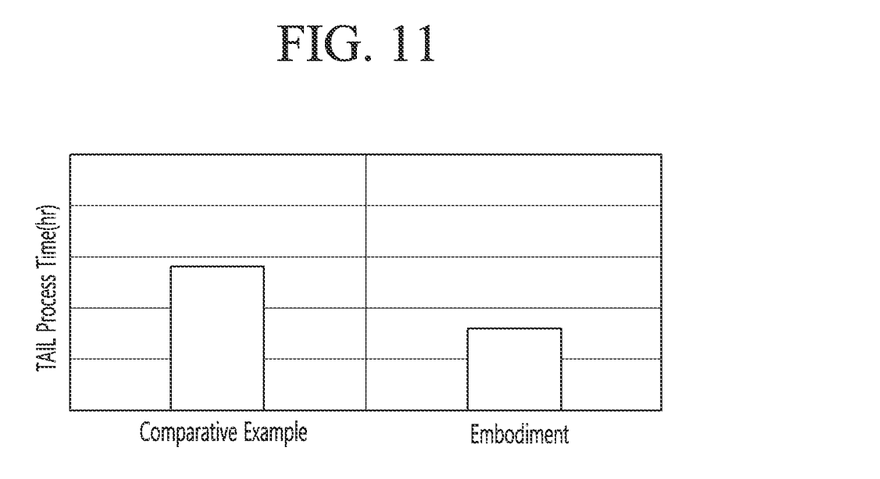
FIG. 11 shows a tail process time in a comparative example and the embodiment.
Figure 12:
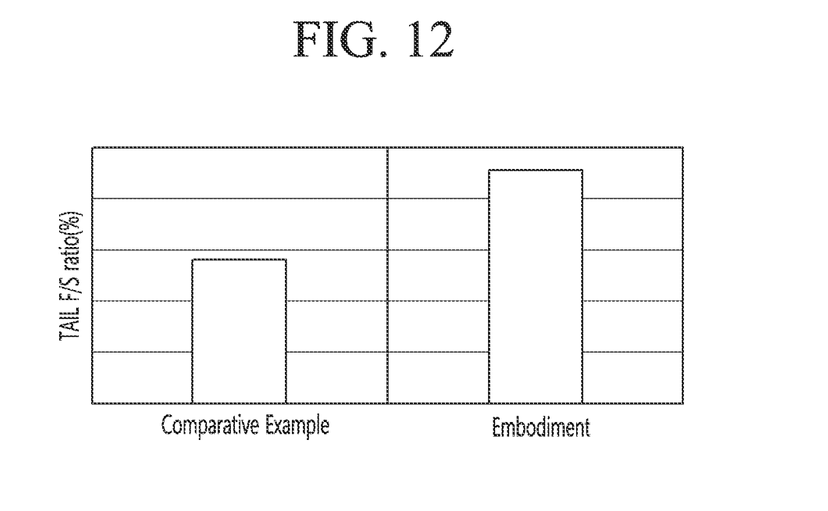
FIG. 12 shows a full structure rate in a comparative example and the embodiment.

FIG. 11 shows the tail process time in a comparative example and the embodiment. 12 shows the full structure rate in a comparative example and the embodiment.

In the comparative example, the tail portion of the ingot is grown according to the target tail temperature manually set by the operator. In the embodiment, an optimized shoulder shape model is obtained using an artificial neural network, and the optimized shoulder shape model is updated based on shoulder information obtained about the shoulder of the growing ingot while actually growing the shoulder of the ingot, and the tail portion of the ingot is grown according to the target tail temperature set based on the updated shoulder shape model.

As shown in FIG. 11, it can be seen that the tail process time is significantly reduced in the embodiment compared to a comparative example.

As shown in FIG. 12, it can be seen that the TAIL F/S (Full Structure) ratio is increased in the embodiment compared to the comparative example. The TAIL F/S ratio refers to a ratio indicating whether the tail portion is completed while maintaining a desired structure.

The above detailed description should not be construed as limiting in all respects and should be considered illustrative. The scope of the embodiments should be determined by reasonable interpretation of the appended claims, and all changes within the equivalent range of the embodiments are included in the scope of the embodiments.

What is claimed is:

1. An ingot growing apparatus for growing an ingot in the order of a neck portion, a shoulder portion, a body portion, and a tail portion, comprising:
   a memory configured to store an artificial neural network; and
   a processor,
   wherein the processor is configured:
   to learn the artificial neural network to obtain a primary shoulder shape model corresponding to training data,
   to update the obtained primary shoulder shape model based on shoulder information obtained during the growth of a shoulder portion of a first ingot to obtain a secondary shoulder shape model,
   to set a target tail temperature for growth of a tail portion of the first ingot based on the secondary shoulder shape model,
   to control the growth of the tail portion of the first ingot according to the set target tail temperature, to generate a primary tail shape model based on tail shape image data obtained when the tail portion of the first ingot is grown, to update the primary tail shape model based on tail information obtained when a tail portion of a second ingot is grown to obtain a secondary tail shape model, to set a target shoulder temperature for growth of a shoulder portion of a third ingot based on the secondary tail shape model, and to control the growth of the shoulder portion of the third ingot according to the set target shoulder temperature.

2. The ingot growing apparatus of claim 1, wherein the training data is a shoulder shape image data collected and accumulated every time shoulder portions of a plurality of ingots grow for a certain period of time.

3. The ingot growing apparatus of claim 1, wherein each of the obtained primary shoulder shape model and the secondary shoulder shape model is a shape according to the growth length.

4. The ingot growing apparatus of claim 1, wherein the obtained shoulder information includes an actual temperature and an actual diameter.

5. The ingot growing apparatus of claim 1, wherein each term of a polynomial of the target tail temperature and each term of a polynomial of the target shoulder temperature set for growth of the shoulder portion of the first ingot have opposite signs to each other.

6. An ingot growing method for growing an ingot in the order of a neck portion, a shoulder portion, a body portion, and a tail portion, comprising:

learning an artificial neural network to obtain a primary shoulder shape model corresponding to training data;

updating the obtained primary shoulder shape model based on shoulder information obtained during the growth of a shoulder portion of a first ingot to obtain a secondary shoulder shape model;

setting a target tail temperature for growth of a tail portion of the first ingot based on the secondary shoulder shape model;

controlling the growth of the tail portion of the first ingot according to the set target tail temperature;

generating a primary tail shape model based on tail shape image data obtained when the tail portion of the first ingot is grown;

updating the primary tail shape model based on tail information obtained when a tail portion of a second ingot is grown to obtain a secondary tail shape model;

setting a target shoulder temperature for growth of a shoulder portion of a third ingot based on the secondary tail shape model; and controlling the growth of the shoulder portion of the third ingot according to the set target shoulder temperature.

7. The ingot growing method of claim 6, wherein the training data is a shoulder shape image data collected and accumulated every time shoulder portions of a plurality of ingots grow for a certain period of time.

8. The ingot growing method of claim 6, wherein each of the obtained primary shoulder shape model and the secondary shoulder shape model is a shape according to the growth length.

9. The ingot growing method of claim 6, wherein the obtained shoulder information includes an actual temperature and an actual diameter.

10. The ingot growing method of claim 6, wherein each term of a polynomial of the target tail temperature and each term of a polynomial of the target shoulder temperature set for growth of the shoulder portion of the first ingot have opposite signs to each other.

* * * * *